United States Patent
Park et al.

(10) Patent No.: US 7,317,653 B2
(45) Date of Patent: Jan. 8, 2008

(54) SEMICONDUCTOR MEMORY DEVICE HAVING SENSE AMP OVER-DRIVING STRUCTURE AND METHOD OF OVER-DRIVING SENSE AMPLIFIER THEREOF

(75) Inventors: Jae Boum Park, Seoul (KR); Byeong Cheol Lee, Seoul (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 98 days.

(21) Appl. No.: 11/319,566

(22) Filed: Dec. 29, 2005

(65) Prior Publication Data

US 2006/0268630 A1  Nov. 30, 2006

(30) Foreign Application Priority Data

May 30, 2005  (KR) ........................ 10-2005-0045669

(51) Int. Cl.
  *G11C 8/00*  (2006.01)

(52) U.S. Cl. ................................. 365/230.03; 365/205
(58) Field of Classification Search ........... 365/230.03, 365/230.06, 205
See application file for complete search history.

(56) References Cited

U.S. PATENT DOCUMENTS 6,459,639 B2 * 10/2002 Nishimura .................. 365/207

FOREIGN PATENT DOCUMENTS

| KR | 1020010063908 | 7/2001 |
| KR | 1020030048291 | 6/2003 |

* cited by examiner

*Primary Examiner*—Huan Hoang
(74) *Attorney, Agent, or Firm*—Lowe Hauptman Ham & Berner LLP

(57) ABSTRACT

The present invention relates to a semiconductor memory device in which current consumption incurred by excessive over-driving can be prevented by dividing a memory core region into a plurality of memory blocks and then over-driving only sense amplifiers of a corresponding memory block.

6 Claims, 2 Drawing Sheets

SEMICONDUCTOR MEMORY DEVICE HAVING SENSE AMP OVER-DRIVING STRUCTURE AND METHOD OF OVER-DRIVING SENSE AMPLIFIER THEREOF

BACKGROUND

1. Field of the Invention

The present invention relates to semiconductor memory devices, and more particularly, to a semiconductor memory device having a sense amp over-driving structure and method of over-driving a sense amplifier thereof.

2. Discussion of Related Art

As a driving voltage of semiconductor memory devices is gradually lowered, the processing speed thereof requires the high speed and several technical solutions for satisfying the requirement have been proposed. One of them is a sense amp over-driving method in which a sense amplifier is driving with a driving power being divided into two. However, the sense amp over-driving method has a drawback in that current of a memory device is excessively consumed due to excessive over-driving.

Of the existing over-driving methods, there is a blind method. In the blind method, when a restore line RTO connected to a PMOS transistor of a sense amplifier (not shown) and a restore line /S connected to a NMOS transistor of the sense amplifier are enabled, an external power supply voltage (VDD) and a cell power supply voltage (Vcore) are shorted for a predetermined pulse period to prevent the cell power supply voltage (Vcore) from lowering. The blind method, however, has a drawback in that excessive current is consumed since current is supplied to the corresponding whole bank.

SUMMARY OF THE INVENTION

An advantage of the present invention is that it prevents current consumption by excessive over-driving by over-driving only a sense amplifier of a corresponding memory block after dividing a memory core region into a plurality of memory blocks.

A semiconductor memory device having a sense amp over-driving structure according to a first aspect of the present invention includes a plurality of memory blocks having sense amplifiers, a sense amp over-driving controller that combines a plurality of block select signals for selecting the memory blocks and a sense amp over-driving signal and generating a plurality of block over-driving signals, and a sense amp over-driver that over-drives only sense amplifier of a memory block in which an actual operation is performed in response to the plurality of block over-driving signals.

A sense amp over-driving method of a semiconductor memory device according to a second aspect of the present invention includes the steps of dividing a memory core region into a plurality of memory blocks having sense amplifiers, combining a plurality of block select signals for selecting the memory blocks and a sense amp over-driving signal for over-driving the sense amplifiers and generating a plurality of block over-driving signals, and over-driving only sense amplifiers of a memory block in which an actual operation is performed, of the plurality of memory blocks in response to the plurality of block over-driving signals.

DETAILED DESCRIPTION OF PREFERRED EMBODIMENTS

The present invention will now be described in connection with preferred embodiments with reference to the accompanying drawings.

Figure 1:
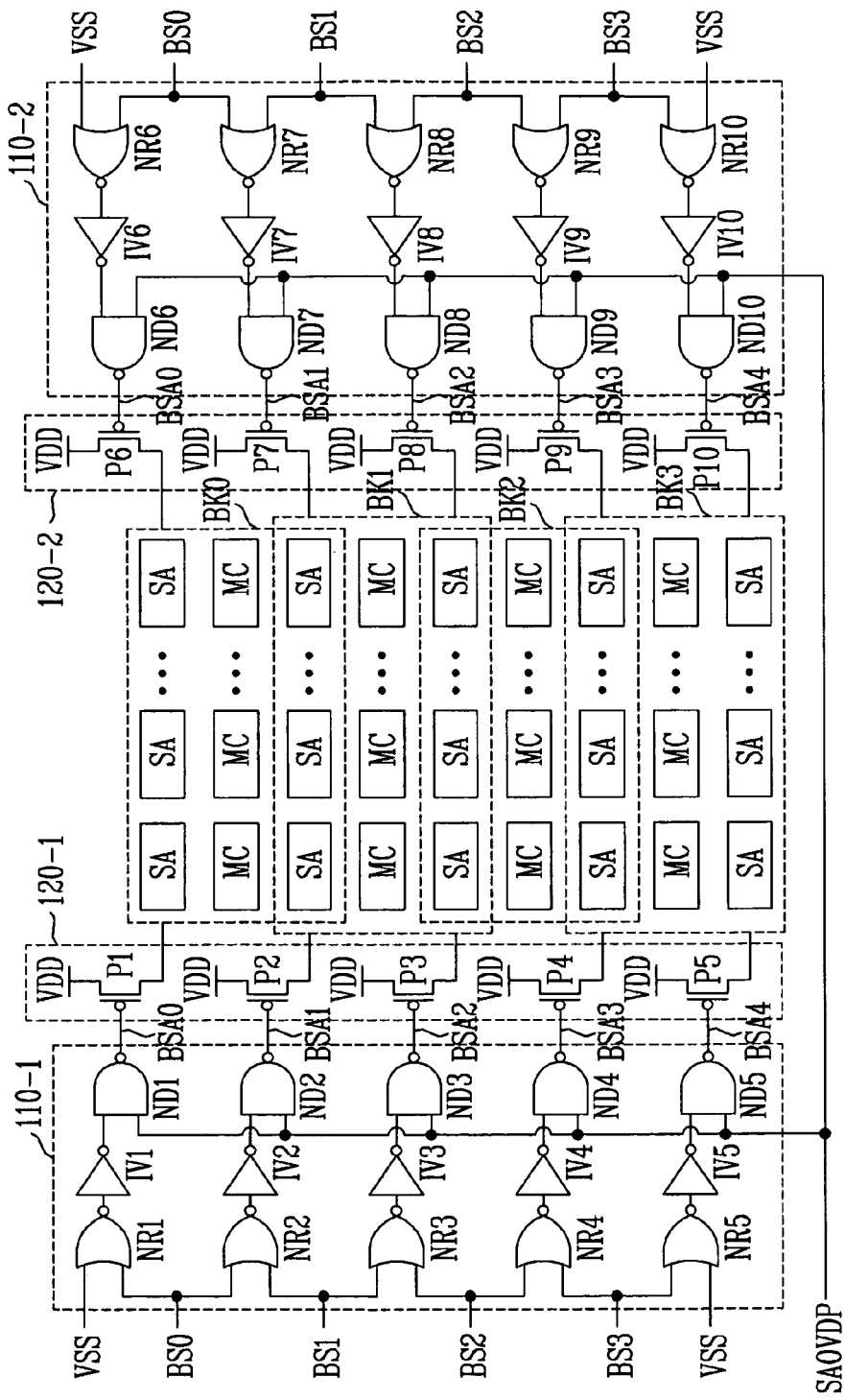
FIG. 1 is a block diagram showing a semiconductor memory device having a sense amp over-driving structure according to a preferred embodiment of the present invention.

FIG. 1 is a block diagram showing a semiconductor memory device having a sense amp over-driving structure according to a preferred embodiment of the present invention.

Referring to FIG. 1, the semiconductor memory device includes memory blocks BK0 to BK3, sense amp over-driving controllers 110-1, 110-2 and sense amp over-driver units 120-1, 120-2.

Only four memory blocks are shown in FIG. 1. However, the number of memory blocks may be varied depending on the size of a bank. Furthermore, sense amplifier regions (SA) on upper/lower sides of a memory cell region (MC). The sense amp over-driving controllers 110-1, 110-2 and the sense amp over-driver units 120-1, 120-2 are disposed on right and left sides of the memory blocks BK0 to BK3.

The sense amp over-driving controller 110-1 logically combines block select signals (BS0 to BS3) and a sense amp over-driving signal (SAOVDP) and generates a block over-driving signal (BSAOVDP0 to BSAOVDP4) for over-driving a sense amplifier within the sense amplifier region (SA) of a corresponding memory block.

The sense amp over-driving controller 110-1 includes NOR gates NR1 to NR5, inverters IV1 to IV5 and NAND gates ND1 to ND5. The NOR gates NR1 performs a NOR operation on a ground voltage (VSS) and a block select signal (BS0). The NOR gates NR2 performs a NOR operation on the block select signals (BS0, BS1). The NOR gates NR3 performs a NOR operation on the block select signals (BS1, BS2). The NOR gates NR4 performs a NOR operation on the block select signals (BS2, BS3). The NOR gates NR5 performs a NOR operation on the block select signal (BS3) and the ground voltage (VSS). The inverters IV1 to IV5 invert output signals of the NOR gates NR1 to NR5, respectively, and output inverted signals.

The NAND gate ND1 performs a NAND operation on the output signal of the inverter IV1 and the sense amp over-driving signal (SAOVDP) and generates a block over-driving signal (BSAOVDP0) for over-driving a sense amplifier within the sense amplifier region (SA) of the first memory block BK0.

The NAND gates ND2 performs a NAND operation on the output signal of the inverter IV2 and the sense amp over-driving signal (SAOVDP) and generates a block over-driving signal (BSAOVDP1) for over-driving a sense amplifier of the sense amplifier region (SA) of the first or second memory block BK0 or BK1.

The NAND gates ND3 performs a NAND operation on the output signal of the inverter IV3 and the sense amp over-driving signal (SAOVDP) and generates a block over-driving signal (BSAOVDP2O) for over-driving a sense amplifier within the sense amplifier region (SA) of the second or third memory block BK1 or BK2.

The NAND gates ND4 performs a NAND operation on the output signal of the inverter IV4 and the sense amp over-driving signal (SAOVDP) and generates a block over-driving signal (BSAOVDP3) for over-driving a sense amplifier within the sense amplifier region (SA) of the third or fourth memory block BK2 or BK3.

The NAND gates ND5 performs a NAND operation on the output signal of the inverter IV4 and the sense amp over-driving signal (SAOVDP) and generates a block over-driving signal (BSAOVDP4) for over-driving a sense amplifier within the sense amplifier region (SA) of the fourth memory block BK4.

The sense amp over-driver units 120-1 over drives sense amplifiers of a corresponding memory block in response to the block over-driving signals (BSAOVDP0 to BSAOVDP4), and includes PMOS transistors MP1 to MP5.

The PMOS transistor MP1 applies a current, which is generated by the external power supply voltage (VDD), to the restore line RTO shown in FIG. 2, which will be described later, in response to the block over-driving signal (BSAOVDP0) when the block select signal (BS0) becomes logic high, thus over-driving corresponding sense amplifiers of the first memory block BK0.

The PMOS transistor MP2 applies a current, which is generated by the external power supply voltage (VDD), to the restore line RTO in response to the block over-driving signal (BSAOVDP1) when the block select signal (BS0 or BS1) becomes logic high, thus over-driving corresponding sense amplifiers of the first or second memory block BK0 or BK1.

The PMOS transistor MP3 applies a current, which is generated by the external power supply voltage (VDD), to the restore line RTO in response to the block over-driving signal (BSAOVDP2) when the block select signal (BS1 or BS2) becomes logic high, thus over-driving corresponding sense amplifiers of the second or third memory block BK2 or BK3.

The PMOS transistor MP4 applies a current, which is generated by the external power supply voltage (VDD), to the restore line RTO in response to the block over-driving signal (BSAOVDP3) when the block select signal (BS2 or BS3) becomes logic high, thus over-driving corresponding sense amplifiers of the third or fourth memory block BK3 or BK4.

The PMOS transistor P5 applies a current, which is generated by the external power supply voltage (VDD), to the restore line RTO in response to the block over-driving signal (BSAOVDP4) when the block select signal (BS3) becomes logic high, thus over-driving corresponding sense amplifiers of the fourth memory block BK4.

Figure 2:
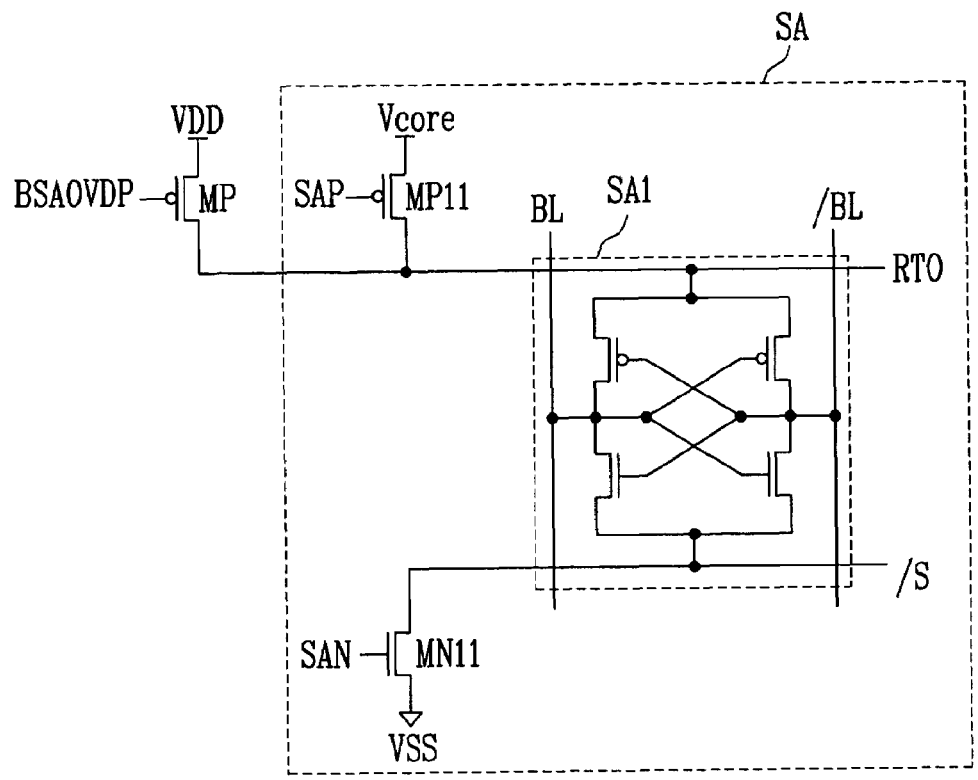
FIG. 2 is a circuit diagram showing a sense amp over-driver and a sense amplifier shown in FIG. 1.

FIG. 2 shows a sense amp over-driver MP shown in FIG. 1, sense amplifier drivers MP11, MN11 within the sense amplifier region (SA) and one sense amplifier SA1. Though one sense amplifier is shown the sense amplifier region (SA), it is assumed that a plurality of sense amplifiers exists in the sense amplifier region (SA).

Figure 3:
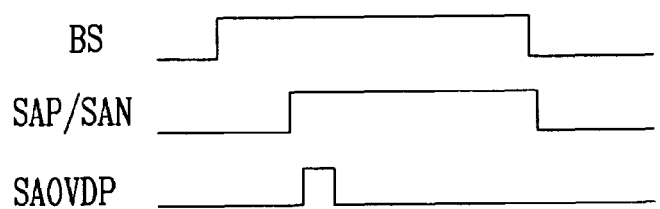
FIG. 3 is a timing diagram showing waveforms of signals of FIG. 1.

FIG. 3 is a timing diagram showing waveforms of signals of FIG. 1.

In FIG. 3, the sense amp over-driving signal (SAOVDP) is generated as a high pulse at the moment when the sense amplifier enable signals (SAP, SAN) are enabled as logic high after the block select signal (BS) is enabled as logic high.

A method of over-driving sense amplifiers within the first memory block BK0 will be described below as an example with reference to FIGS. 2 and 3.

If the first block select signal (BS1) is enabled as logic high, the sense amplifier enable signals (SAP, SAN) are driven as logic high after a predetermined time elapses. If the sense amp over-driving signal (SAOVDP) becomes a high pulse, the sense amp over-driving controllers 110-1, 110-2 generate the block over-driving signals (BSAOVDP0, BSAOVDP1) of a low pulse. Therefore, the PMOS transistors MP1, MP2, MP6, MP7 within the sense amp over-driver units 120-1, 120-2 are turned on, so that a current generated by the external power supply voltage (VDD) is applied to the restore line RTO. At this time, the sense amplifier drivers MP11, MN11 within the sense amplifier region (SA) shown in FIG. 2 are already turned on before the sense amp over-drivers MP1, MP2, MP6, MP7 are turned on. Therefore, if the sense amp over-drivers MP1, MP2, MP6, MP7 are turned on, a current by the external power supply voltage (VDD) and a current by the cell power supply voltage (Vcore) become short and only sense amplifiers of a selected memory block BK0 are over-driven accordingly.

As described above, only sense amplifiers of a memory block in which an actual operation is performed are over-driven using the block select signal (BS), and sense amplifiers of a memory block in which an actual operation is not performed are not over-driven. It is thus possible to prevent current consumption incurred by excessive over-driving.

Figure 4:
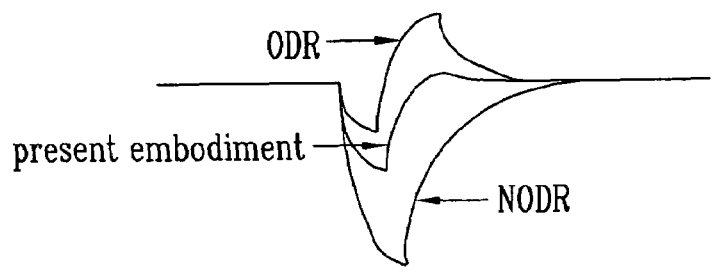
FIG. 4 shows a current waveform by sense amp over-driving of FIG. 1.

FIG. 4 shows a current waveform by sense amp over-driving of FIG. 1. Only sense amplifiers of a memory block in which an operation is actually performed are over-driven. Therefore, it can be seen that current by over-driving is not excessively consumed. In FIG. 4, ODR indicates a case where over-driving is performed and NODR indicates a case where over-driving is not performed.

As described above, according to the present invention, only sense amplifiers of a memory block requiring an operation are over-driven. Therefore, existing excessive current consumption can be saved, which is very effective in low-power design.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A semiconductor memory device comprising:
a plurality of memory blocks having sense amplifiers;
a sense amp over-driving controller that combines a plurality of block select signals for selecting the memory blocks and a sense amp over-driving signal and generating a plurality of block over-driving signals,
wherein the over-driving controller comprises:
a plurality of first logic elements that logically combine the plurality of block select signals;
a plurality of inverting elements that inverts output signals of the plurality of first logic elements, respectively; and
a plurality of second logic elements that logically combine the output signals of the plurality of inverting elements and the sense amp over-driving signal and generate the plurality of block over-driving signals; and
sense amp over-driver units that over-drive a sense amplifier of a memory block in which an actual operation is performed in response to the plurality of block over-driving signals.

2. The semiconductor memory device as claimed in claim 1, wherein the sense amp over-driving controller and the sense amp over-driver units are disposed on the right and left sides of the plurality of memory blocks.

3. The semiconductor memory device as claimed in claim 1, wherein the sense amp over-driving controller activates predetermined block over-driving signals for driving the sense amplifier of the memory block in which the actual operation is performed, of the plurality of block over-driving signals, in response to a block select signal that is enabled, of the plurality of block select signals, and the sense amp over-driving signal.

4. The semiconductor memory device as claimed in claim 1, wherein the sense amp over-driver units comprise a plurality of sense amp over-drivers for over-driving the sense amplifier of the memory block in which the actual operation is performed in response to block over-driving signals that are activated, of the plurality of block over-driving signals.

5. The semiconductor memory device as claimed in claim 4, wherein each of the plurality of sense amp over-drivers includes a transistor that applies a current generated by an external power supply voltage to a restore line of the sense amplifiers in response to the activated block over-driving signals.

6. A sense amp over-driving method of a semiconductor memory device, comprising:
dividing a memory core region into a plurality of memory blocks having sense amplifiers;
combining a plurality of block select signals for selecting the memory blocks and a sense amp over-driving signal for over-driving the sense amplifiers and generating a plurality of block over-driving signals; and
over-driving only sense amplifiers of a memory block in which an actual operation is performed, of the plurality of memory blocks in response to the plurality of block over-driving signals,
wherein only predetermined block over-driving signals for driving only sense amplifiers of a memory block in which the actual operation is performed in response to a block select signal that is enabled, of the plurality of block select signals, and the sense amp over-driving signal and only sense amplifiers of a memory block in which the actual operation is performed are over-driven by applying a current, which is generated by an external power supply voltage, to a restore line of the sense amplifiers in response to an activation of the block over-driving signals.

* * * * *